United States Patent [19]

Kohno et al.

[11] Patent Number: 5,187,112
[45] Date of Patent: Feb. 16, 1993

[54] METHOD FOR PRODUCING A SEMICONDUCTOR DEVICE

[75] Inventors: Yasutaka Kohno; Tomoki Oku, both of Itami, Japan

[73] Assignee: Mitsubishi Denki Kabushiki Kaisha, Tokyo, Japan

[21] Appl. No.: 504,837

[22] Filed: Apr. 5, 1990

[30] Foreign Application Priority Data

Apr. 12, 1989 [JP] Japan .................................. 1-93579

[51] Int. Cl.$^5$ .......................................... H01L 21/265
[52] U.S. Cl. .................................. 437/41; 437/44; 437/912
[58] Field of Search ........................ 437/41, 44, 912

[56] References Cited

U.S. PATENT DOCUMENTS

| | | | |
|---|---|---|---|
| 4,358,340 | 11/1982 | Fu | 156/643 |
| 4,645,563 | 2/1987 | Terada | 437/41 |
| 4,782,031 | 11/1988 | Hagio et al. | 437/912 |
| 4,855,246 | 8/1989 | Codella et al. | 437/912 |
| 4,962,054 | 10/1990 | Shikata | 437/912 |
| 4,992,387 | 2/1991 | Tamura | 437/912 |
| 4,997,779 | 3/1991 | Kohno | 437/41 |

FOREIGN PATENT DOCUMENTS

| | | |
|---|---|---|
| 0113059 | 7/1984 | European Pat. Off. . |
| 0152615 | 8/1985 | European Pat. Off. . |
| 0177129 | 4/1986 | European Pat. Off. . |
| 0337299 | 10/1989 | European Pat. Off. . |
| 62-33476 | 2/1987 | Japan . |
| 62-86869 | 4/1987 | Japan . |
| 62-86870 | 4/1987 | Japan . |
| 253632 | 10/1990 | Japan .................... 437/912 |

OTHER PUBLICATIONS

Enoki et al., "Optimization of GaAs . . . MMIC", ED8-6-9, pp. 23-28.

*Primary Examiner*—Brian E. Hearn
*Assistant Examiner*—Linda J. Fleck
*Attorney, Agent, or Firm*—Leydig, Voit & Mayer

[57] ABSTRACT

A method for producing a field effect transistor includes depositing an insulating film on an active layer produced in a semiconductor substrate and removing a part of the insulating film, leaving a side wall substantially perpendicular to the substrate. A refractory metal is deposited on the surface of the semiconductor substrate and the insulating film. The refractory metal is removed except for a portion at the side wall of the insulating film to produce a gate electrode. A high dopant concentration region is ion implanted using the insulating film and refractory metal as a mask. The insulating film is removed and an intermediate dopant concentration region is ion implanted using the refractory metal as a mask. A source electrode is produced on the high dopant cocentration region and a drain electrode is produced on the intermediate dopant concentration region. The invention may be used to produce asymmetrically doped drain and gate regions and an asymmetrically disposed gate electrode.

6 Claims, 6 Drawing Sheets

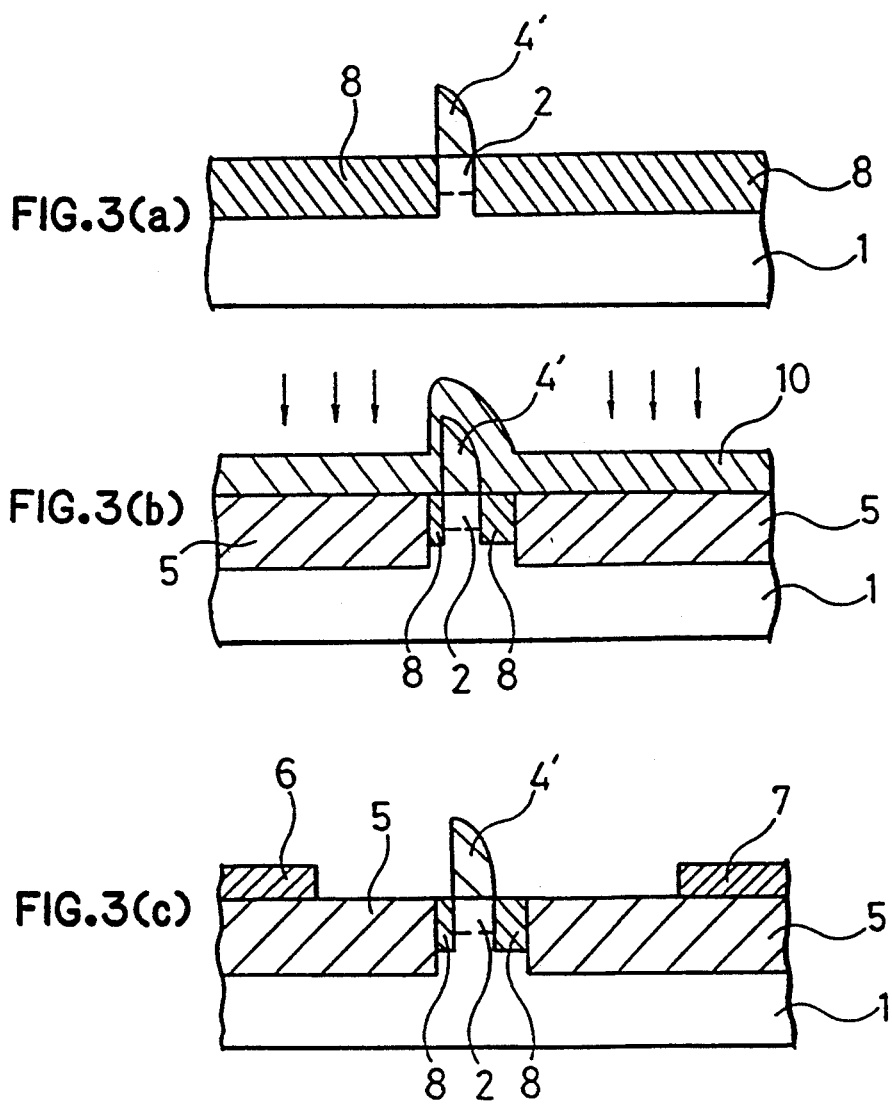

METHOD FOR PRODUCING A SEMICONDUCTOR DEVICE

FIELD OF THE INVENTION

The present invention relates to a method for producing a semiconductor device and, more particularly to a method for producing a narrow gate and an offset gate of a refractory metal in a self-aligned gate GaAs field effect transistor.

BACKGROUND OF THE INVENTION

FIGS. 5(a) to 5(d) illustrate process steps in a prior art method for producing a semiconductor device. In FIG. 5, reference numeral 1 designates a semi-insulating GaAs substrate. An active layer 2 is produced in the GaAs substrate 1. A refractory metal 4 is disposed on the active layer 2. A gate electrode 4' is made of the refractory metal 4. An n+ type diffusion layer 5 is disposed at both sides of the gate electrode 4'. A source electrode 6 and a drain electrode 7 are disposed on the n+ type diffusion layer 5. Reference numeral 11 designates a photoresist.

The production process will be described.

First of all, as shown in FIG. 5(a), an active layer 2 is produced at a desired position in a semi-insulating GaAs substrate 1 by ion implantation.

Next, as shown in FIG. 5(b), a refractory metal 4, such as tungsten silicide (hereinafter referred to as $WSi_x$) is deposited on the entire surface of the semi-insulating GaAs substrate 1 by sputtering or vapor deposition, and a pattern of photoresist 11 is formed where a gate is to be prepared.

Next, as shown in FIG. 5(c), the $WSi_x$ 4 is removed by reactive ion etching using the photoresist 11 as a mask, thereby producing a gate electrode 4'.

Next, as shown in FIG. 5(d), ion implantation, using the $WSi_x$ 4' as a mask, produces a high dopant concentration regions 5 (hereinafter referred to as n+ layer) after annealing, and a drain electrode 6 and a source electrode 7 are respectively produced thereon.

In the prior art production method of a semiconductor device, in order to produce a gate electrode 4', patterning of the photoresist 11 is required, and the precision of pattern gate depends on the precision of the photolithographic alignment technique. Furthermore, because ion implantation uses the $WSi_x$ 4' as a mask, the n+ layers 5 below the source electrode 7 and the gate electrode 4' are located close to each other, and, thus, the source resistance is lowered. This is advantageous for the gain of the FET. However, since the n+ layers below the drain electrode 6 and the gate electrode 4' are close to each other, the gate-drain breakdown voltage is reduced. This makes it difficult to apply this structure to high power analog ICs.

SUMMARY OF THE INVENTION

An object of the present invention is to provide a method for producing a semiconductor device producing a narrow refractory metal gate without requiring photolithography and enhancing the gate-drain breakdown voltage while keeping the source resistance low.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first production method of the present invention, an insulating film is produced on an active layer, a refractory metal plated on the entire surface of the semiconductor substrate and partially removed but left in place at a side wall of the insulating film to produce a gate electrode, a high dopant concentration region is produced by ion implantation using the insulating film and the refractory metal as a mask, the insulating film is removed, an intermediate dopant concentration region is produced by ion implantation using the refractory metal as a mask, a source electrode is produced on the high dopant concentration region, and a drain electrode is produced on the intermediate dopant concentration region.

In this first production method, since the refractory metal at the side wall of the insulating film is used as a gate electrode, a narrow refractory metal gate can be produced without being restricted by the precision of photolithography. Furthermore, since a high dopant concentration region is produced beneath the source electrode and an intermediate dopant concentration region is produced beneath the drain electrode, the gatedrain breakdown voltage is enhanced and the source resistance is reduced.

According to a second production method of the present invention, after the refractory metal is partially removed but left at the side wall of the insulating film in the above-described first production method, an intermediate dopant concentration region is produced by ion implantation using the first insulating film and the refractory metal as a mask, a second insulating film is deposited on the entire surface of semiconductor substrate and is partially removed but left in place at a side wall of the refractory metal, the first insulating film is removed, a high dopant concentration region is produced by ion implantation using the refractory metal and the second insulating film remaining at the side wall as a mask, a drain electrode is produced at the side where the intermediate dopant concentration region is produced and a source electrode is produced, at the side opposite thereto.

According to a third production method of the present invention, after the refractory metal is partially removed but left in place at the side wall of the insulating film in the above-described first production method, the insulating film is removed, an intermediate dopant concentration region is produced by ion implantation using the refractory metal which is to become a gate electrode as a mask, a second insulating film is deposited on the entire surface of semiconductor substrate, masks having asymmetrical configurations are produced at both side walls of the gate electrode, a high dopant concentration region is produced by ion implantation using the second insulating film as a mask, a drain electrode is produced at the side where a broad width intermediate dopant concentration region is produced, and a source electrode is produced at the side opposite thereto.

According to a fourth production method of the present invention, after the second insulating film is deposited on the entire surface of semiconductor substrate in the above-described third production method, the second insulating film is partially removed but left in place at both side walls of the refractory metal in asymmetrical configurations, a high dopant concentration region is produced by ion implantation using the second insulating film remaining at both side walls and the refractory metal as a mask, a drain electrode is produced at the side where a wider intermediate dopant concentration region is produced and a source electrode is produced, at the side opposite thereto.

In these second, third, and fourth production methods, similar to the above-described first production method, since the refractory metal remaining at the side wall of the insulating film is used as a gate electrode, a narrow refractory metal gate can be produced without being restricted by the precision of photolithography. Furthermore, the high dopant concentration region below the source electrode is adjacent the gate electrode and the distance between the gate electrode and the high dopant concentration region below the drain electrode is lengthened by producing an intermediate dopant concentration region between the gate electrode and the high dopant concentration region, thereby enhancing the gate-drain breakdown voltage while holding the source resistance at a low value. Furthermore, a narrow interval is provided between the gate electrode and the high dopant concentration region below the source electrode by producing an intermediate dopant concentration region that is narrower than the intermediate dopant concentration region disposed between the gate electrode and the high dopant concentration region below the drain electrode, thereby preventing current leakage between the gate electrode and the high dopant concentration region below the source electrode.

BRIEF DESCRIPTION OF THE DRAWINGS

FIGS. 3(a) to 3(c) are cross-sectional views illustrating the process steps of a method for producing a semiconductor device according to a third embodiment of the present invention;

DETAILED DESCRIPTION OF THE PREFERRED EMBODIMENT

Figure 1A:
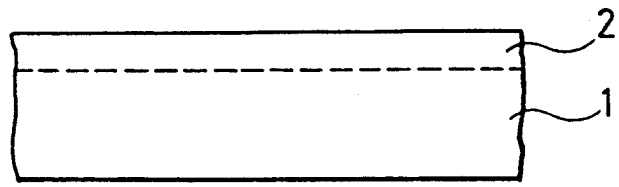
FIGS. 1(a) to 1(g) are cross-sectional views illustrating the process steps of a method for producing a semiconductor device according to a first embodiment of the present invention.

FIGS. 1(a) to 1(g) are cross-sectional views illustrating process steps for producing a semiconductor device according to a first embodiment of the present invention.

In the figures, reference numeral 1 designates a semi-insulating GaAs substrate. An active layer 2 is produced on the GaAs substrate 1. Reference numeral 3 designates an insulating film comprising $SiO_2$. A refractory metal 4 such as tungsten silicide is disposed on the active layer 2. A gate electrode 4' is produced from this refractory metal 4. Reference numeral 5 designates a high dopant concentration region (hereinafter referred to as n+ region). Reference numerals 6 and 7 designate a source electrode and a drain electrode, respectively. Reference numeral 8 designates an intermediate dopant concentration region (hereinafter referred to as n' region).

The production method will be described.

Figure 1B:
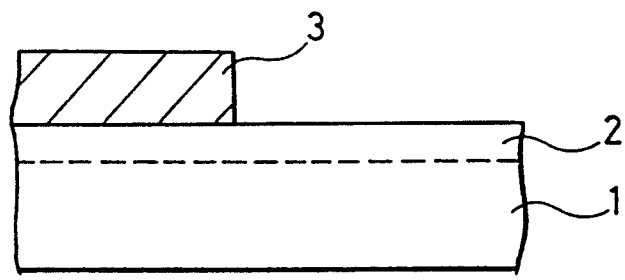

First of all, as shown in FIG. 1(a), silicon ions are implanted into the semi-insulating GaAs substrate 1 at 50 KeV and $1.5 \times 10^{12}/cm^2$, thereby producing an active layer 2 600 angstroms thick. A $SiO_2$ film 3 is deposited on the entire surface of substrate to a thickness of about 3000 angstroms and, thereafter, as shown in FIG. 1(b), the $SiO_2$ film 3 is patterned by reactive ion etching using a mixture of $CHF_3+O_2$.

Figure 1C:
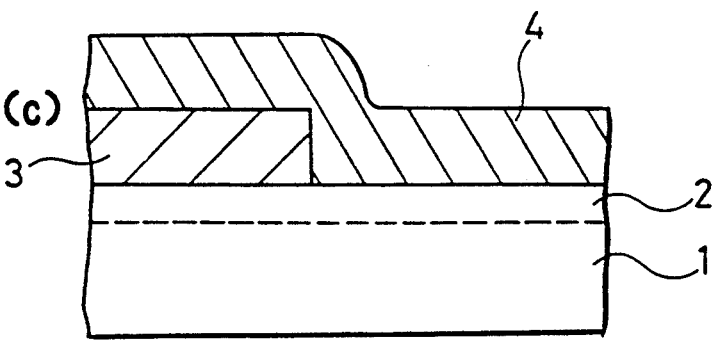

Next, as shown in FIG. 1(c), $WSi_x$ 4 is plated on the entire surface of GaAs substrate 1 to a thickness of about 3000 angstroms by sputtering or CVD using a mixture of $WF_6$ and $SiH_4$.

Figure 1D:
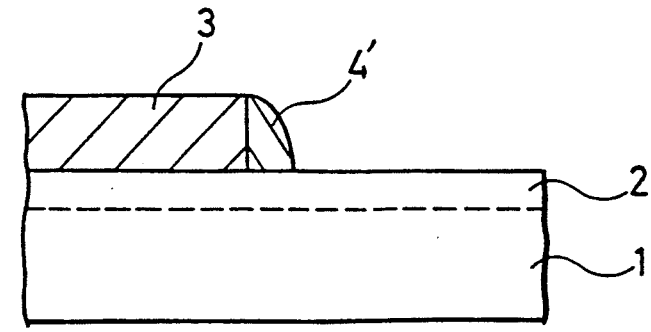

As shown in FIG. 1(d), the $WSi_x$ 4 is anisotropically etched by reactive ion etching using a mixture of $CF_4+O_2$, leaving $WSi_x$ gate electrode 4' at the side wall of the $SiO_2$ film 3. In this case, the width of $WSi_x$ 4', that is, the gate length has an upper limit of about 0.2 microns. Herein, the gate length is controlled by the thickness of $WSi_x$ 4.

Figure 1E:
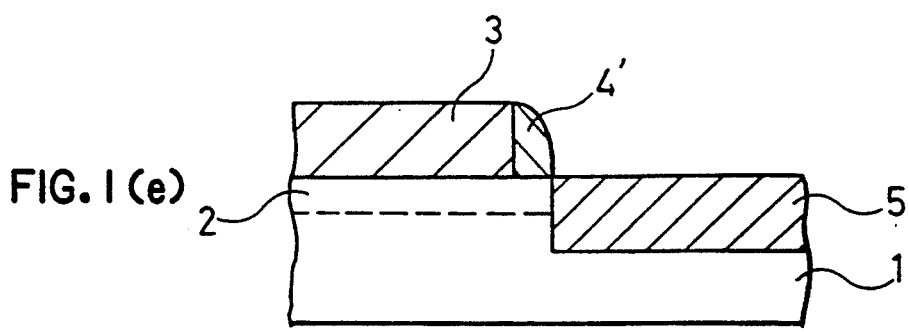

Next, as shown in FIG. 1(e), silicon ions are implanted at a concentration of $3 \times 10^{13}/cm^2$ using the $SiO_2$ film 3 and $WSi_x$ gate electrode 4' as a as a mask, thereby producing a high dopant concentration region (n+ region) 5 1000 angstroms thick.

Figure 1F:
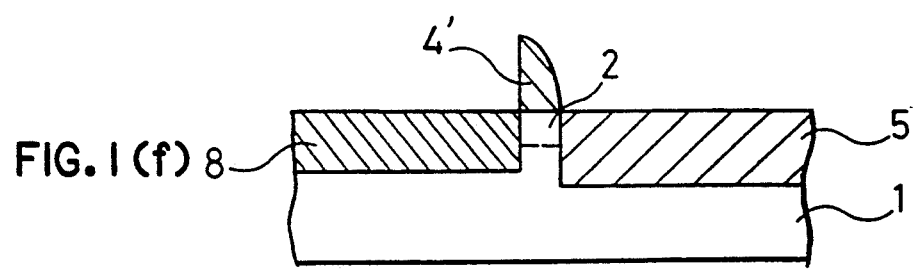

As shown in FIG. 1(f), the $SiO_2$ film 3 is removed using a hydrofluoric acid solution having a ratio of 1:30 for $HF:H_2O$, and silicon ions are implanted to a concentration of $7 \times 10^{12}/cm^2$ using the gate electrode 4' as a mask, thereby producing an intermediate dopant concentration region (n' region) 8 800 angstroms thick. In this case, silicon ions are also implanted into the n+ region 5, but the dopant concentration of the n+ region 5 is quite high relative to the concentration of n' layer 8, thereby resulting in essentially no change in dopant concentration nor any problems.

Figure 1G:
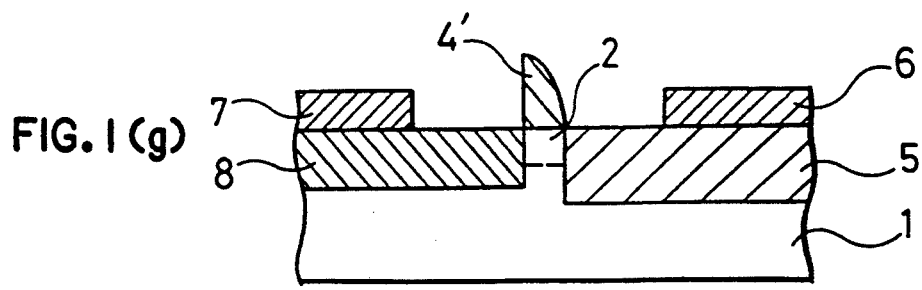

As shown in FIG. 1(g), after annealing at 800° C. for about 45 minutes, AuGe/Ni/Au is deposited by deposition and lift-off, thereby producing a source electrode 6 on the n+ region 5 and a drain electrode 7 on the n' region 8. Thus, a field effect transistor having a narrow gate is completed.

In this production method, since the refractory metal remaining at the side wall of the insulating film after the etching is used as a gate electrode, a narrow refractory metal gate can be produced without being restricted by the precision of photolithography. Furthermore, since the impurity concentration of the drain electrode 7 side is lower than that of the source electrode 6 side and the depth of the drain region 8 is shallower than the source region 5, the gate-drain breakdown voltage is enhanced while the source resistance remains low.

FIGS. 2(a) to 2(e) are cross-sectional views illustrating process steps for producing a semiconductor device according to a second embodiment of the present invention.

Beginning from the structure of FIG. 1(d), silicon ions are implanted at a concentration of $7 \times 10^{12}/cm^2$ using the $SiO_2$ film 3 and $WSi_x$ gate electrode 4' as a mask, thereby producing an n' region 8. A $Si_3N_4$ film 9 is deposited on the entire surface of semi-insulating GaAs substrate 1 by CVD, thereby producing the structure of FIG. 2(a).

Figure 2A:
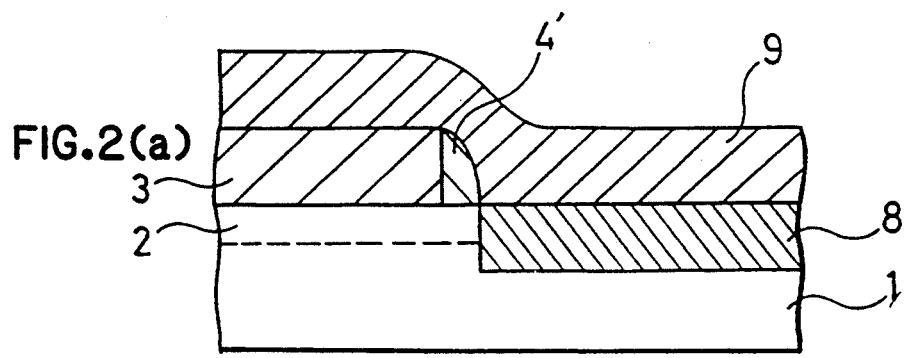
FIGS. 2(a) to 2(e) are cross-sectional views illustrating the process steps of a method for producing a semiconductor device according to a second embodiment of the present invention.
Figure 2B:
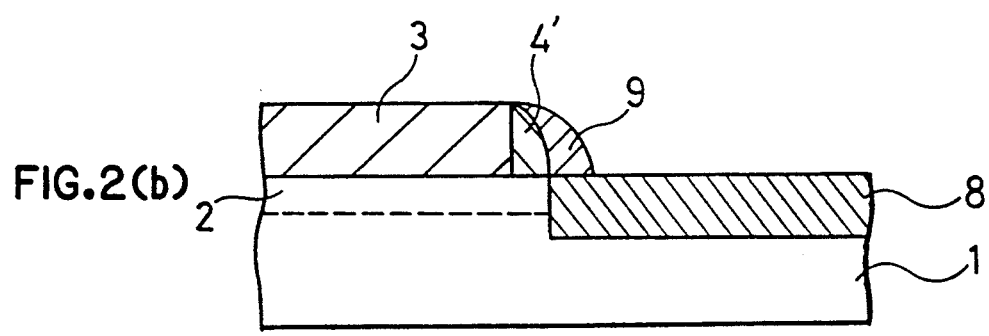

Next, as shown in FIG. 2(b), the $Si_3N_4$ film 9 is anisotropically etched by reactive ion etching leaving a portion thereof at the side of the $WSi_x$ gate electrode 4'.

Figure 2C:
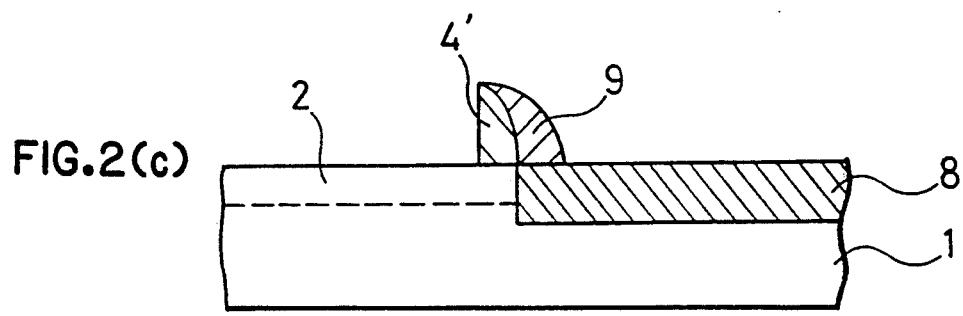

Next, as shown in FIG. 2(c), the $SiO_2$ film 3 is removed using a hydrofluoric acid solution having a ratio of 1:30 for $HF:H_2O$. In this case, since the etching rate of the remaining $Si_3N_4$ film 9 by the hydrofluoric acid solution is less than 1/10 of the etching rate of the remaining $SiO_2$ film 3, the $Si_3N_4$ film 9 will hardly be etched.

Figure 2D:
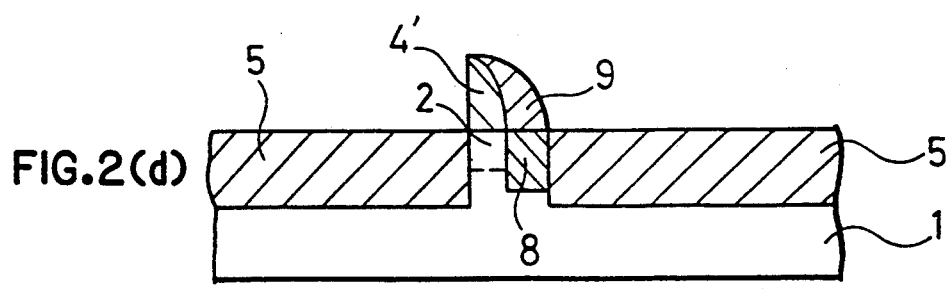
Figure 2E:
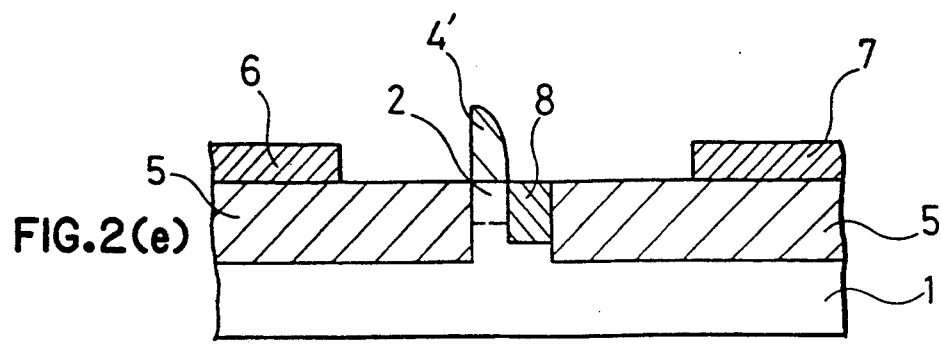

As shown in FIG. 2(d), silicon ions are implanted an impurity concentration of $3 \times 10^{13}/cm^2$ using the $WSi_x$ gate electrode 4' and the remaining $Si_3N_4$ film 9 as a mask, thereby producing n+ regions 5 and leaving the part of n' region 8 below the remaining $Si_3N_4$ film 9 in place;

Next, as shown in FIG. 2(e), after annealing at 800° C. for about 45 minutes, the remaining $Si_3N_4$ film 9 is removed, and an AuGe/Ni/Au film is plated by deposition and lift-off region, thereby producing a drain electrode 7 on the n+ region 5 at the side where the n' region 8 is left and a source electrode 6 is produced on the n+ region 5 at the side opposite thereto, thereby completing a field effect transistor.

Also in this production method, similarly as in the first production method, since the refractory metal remaining at the side wall of insulating film 3 is used as a gate electrode, a narrow refractory metal gate electrode can be produced without being restricted by the precision of the photolithography technique. Furthermore, since the n+ region 5 below the source electrode 6 and the gate electrode 4' are close to each other and the n+ region 5 below the drain electrode 7 and the gate electrode 4' are spaced from each other by the remaining part of the n' region 8 between the n+ region 5 and the gate electrode 4', the source resistance is lowered and the gate drain breakdown voltage is enhanced.

FIGS. 3(a) to 3(c) are cross-sectional side views illustrating process steps for producing a semiconductor device according to a third embodiment of the present invention.

Beginning from the structure of FIG. 1(d), the $SiO_2$ film 3 is removed using a hydrofluoric acid solution having a ratio of 1:30 for $HF:H_2O$, and thereafter silicon ions are implanted to an impurity concentration of $7 \times 10^{12}/cm^2$ using the $WSi_x$ gate electrode 4' as a mask, thereby producing regions n' regions 8 as shown in FIG. 3(a).

As shown in FIG. 3(b), an $SiO_2$ film 10 is deposited on the entire surface of semi-insulating GaAs substrate 1 to a thickness of about 2000 angstroms. In this case, since the configuration of $WSi_x$ gate electrode 4' is asymmetrical, the $SiO_2$ film 10 is about 1000 angstroms thick at the left side wall of $WSi_x$ gate electrode 4' in FIG. 3(b), and about 2000 angstroms are obtained at the opposite, curved side wall of $WSi_x$ gate electrode 4. Therefore, the $SiO_2$ film 10 has an asymmetrical configuration at left and right sides of the $WSi_x$ gate electrode 4'. Accordingly, when an n+ regions 5 are produced by ion implanting silicon ions at an impurity concentration of $3 \times 10^{13}/cm^2$ using the $SiO_2$ film 10 as a mask, the distances between the n+ regions 5 and $WSi_x$ gate electrode 4' are also asymmetrical. Furthermore, the distances between the n+ regions 5 and the $WSi_x$ gate electrode 4' are controlled by the thicknesses of the $SiO_2$ film 10 at the sides of the gate electrode 4'. This process leaves residual portions of n' regions 8 at both sides of the gate electrode 4'. The residual n' regions are asymmetrical because of the asymmetry of the $SiO_2$ film at the sides of the gate electrode 4'.

Next, after annealing, the $SiO_2$ film 10 is removed, and AuGe/Ni/Au is deposited by deposition and liftoff, thereby producing a drain electrode 7 on the n+ region 5 at the of the gate electrode 4' where the wider n' region 8 is left and a source electrode 6 on the opposite side of the gate electrode 4'.

In this production method, similar to the first and second production methods, a narrow gate electrode is produced, and a field effect transistor having a high gate-drain breakdown voltage is obtained while keeping the source resistance low.

Since a narrow interval is provided between the gate electrode 4' and the n+ region 5 below the source electrode 6 by the n' region 8, which is narrower than the n' region 8 between the gate electrode 4' and the n+ region 5 below the drain electrode 7, the leakage current between the gate electrode and the n+ region below the source electrode is prevented and an improved efficiency field effect transistor is obtained.

Figure 4A:
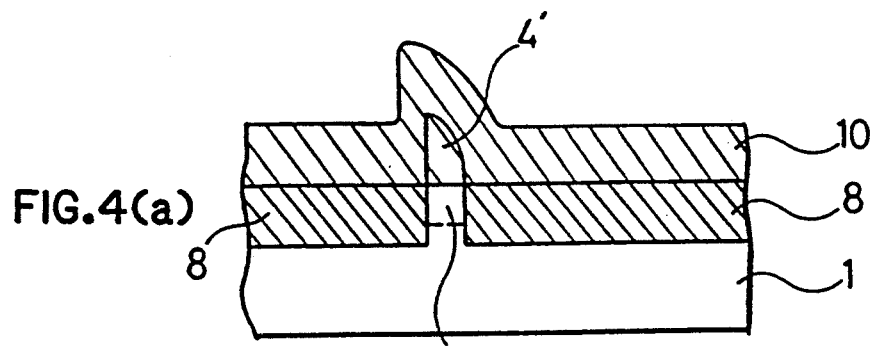
FIGS. 4(a) to 4(c) are cross-sectional views illustrating the process steps of a method for producing a semiconductor device according to a fourth embodiment of the present invention.
Figure 4B:
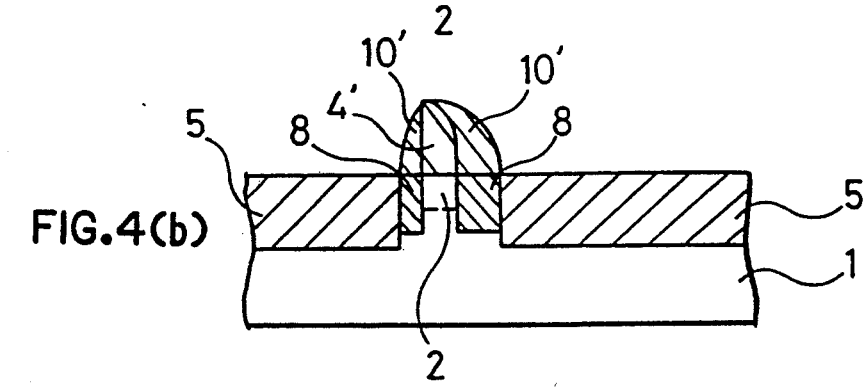
Figure 4C:
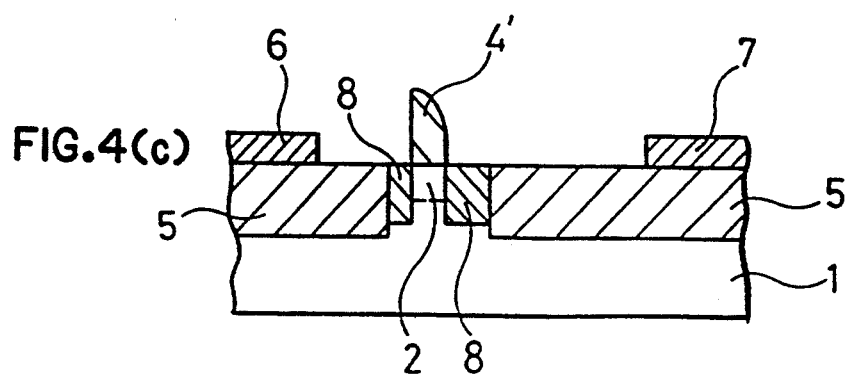
Figure 5A:
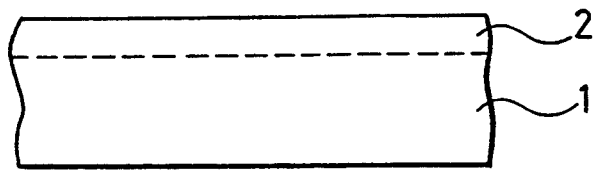
FIGS. 5(a) to 5(d) are cross-sectional views illustrating the process steps of a prior art method for producing a semiconductor device.
Figure 5B:
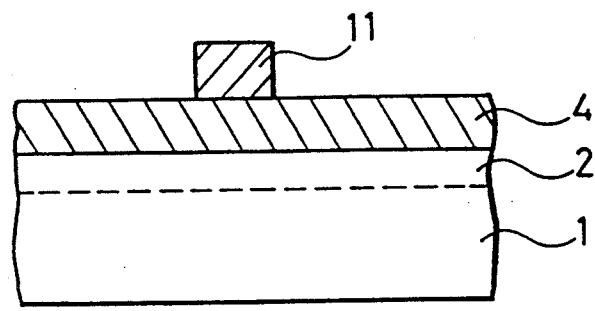
Figure 5C:
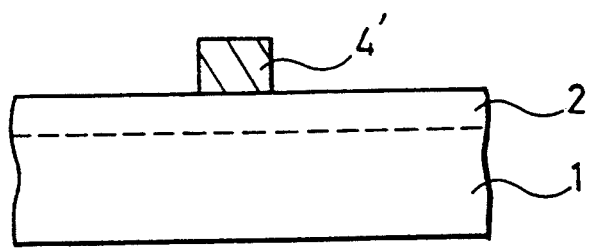
Figure 5D:
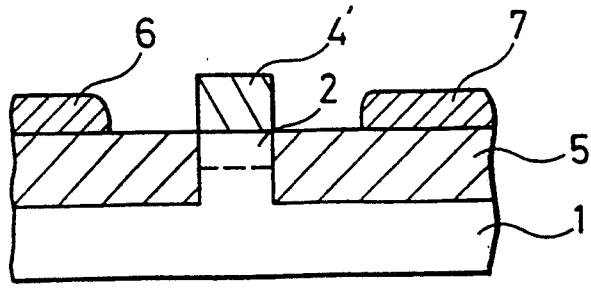

FIGS. 4(a) to 4(c) are cross-sectional views illustrating process steps for producing a semiconductor device according to a fourth embodiment of the present invention.

Beginning from the structure of FIG. 3(a), an $SiO_2$ film 10 is deposited on the entire surface of semi-insulating GaAs substrate 1 to a thickness of about 2000 angstroms, thereby resulting in the structure of FIG. 4(a).

The $SiO_2$ film 10 is anisotropically etched by reactive ion etching using a mixture of $CHF_3+O_2$ to leave portions of the film 10 at both sides of the $WSi_x$ gate electrode 4'. Then, since the $WSi_x$ 4' gate electrode has an asymmetrical configuration at the left and right sides of FIG. 4(b), the thicknesses of the $SiO_2$ films 10' remaining at the sides of $WSi_x$ 4' also are asymmetrical. An $SiO_2$ film 10' about 1000 angstroms wide is produced at the vertical side wall of $WSi_x$ 4' gate electrode and another film 10' about 2000 angstroms wide is produced at the curved side wall of $WSi_x$ gate electrode 4'.

As shown in FIG. 4(b), silicon ions are implanted at an impurity concentration of $3 \times 10^{13}/cm^2$ using the $SiO_2$ films 10' at the both sides of the $WSi_x$ gate electrode 4' as a mask, thereby producing an n+ regions 5. In this case, the distances between the n+ layers 5 and the $WSi_x$ gate electrode 4' are asymmetrical. Furthermore, the distances between the n+ regions 5 and the $WSi_x$ 4' gate electrode are controlled by the films thicknesses of the $SiO_2$ film 10'.

After annealing, the $SiO_2$ films 10' are is removed and AuGe/Ni/Au is deposited by deposition and liftoff, thereby producing a drain electrode 7 on the n+ region 5 at the side of the gate electrode 4' where the wider n' region 8 is left and a source electrode 6 on the n+ region 5 at the opposite side of the gate electrode 4'.

In this production method, similar to the first to third production methods, since photolithography is not required for the production of the gate electrode, a narrow gate electrode can be produced with high precision. Furthermore, since a narrow interval is provided between the gate electrode 4' and then the n+ region 5 below the source electrode, current leakage between the gate electrode 4' and the n+ region 5 is effectively prevented and that the gate-drain breakdown voltage is enhanced while suppressing the source resistance.

While in the above-described first to fourth embodiments $WSi_x$ is used for the refractory metal of the gate electrode 4', WSiN or WN may be used with the same effects as described above.

While in the above-described second, third, and fourth embodiments the insulating films produced at the side walls of the gate electrode 4' are removed after the ion implantation, these films may be left in place with the same effects as described above.

As is evident from the foregoing description, according to the present invention, the refractory metal is deposited on the entire surface of the semiconductor substrate, covering an insulating film which is deposited on the active layer produced on the semiconductor substrate. Thereafter, the refractory metal is removed, leaving a residual portion at the side wall of the insulating film, thereby producing a gate electrode. Accordingly, patterning by photolithography is not required to produce the gate electrode and the gate length is not restricted by the precision of photolithography, whereby a field effect transistor having a narrow gate is precisely and reproducibly produced.

Furthermore, an n+ region of a high dopant concentration is disposed below the source electrode and an n' region of a lower dopant concentration is disposed below the drain electrode. In order to obtain an offset structure gate, the distance between the gate electrode and the n+ region below the drain electrode is lengthened by the insertion of an n' region between the gate electrode and the n+ region while maintaining a short distance between the gate electrode and the n+ region below the source electrode. Therefore, the source resistance can be reduced and the gate-drain breakdown voltage can be enhanced. Furthermore, since a narrow spacing is provided between the gate electrode and the n+ region below the source electrode by inserting an n' region having a narrower width than the n' region between the gate electrode and the n+ region below the drain electrode, current leakage between the gate electrode and the n+ region below the source electrode is prevented, and an improved efficiency field effect transistor is obtained.

What is claimed is:

1. A method for producing a semiconductor device comprising:
   forming an active region in and at a surface of a semiconductor substrate;
   depositing a first insulating film on said active region;
   removing a portion of said first insulating film at the active region, leaving a side wall of said first insulating film transverse to the surface of said substrate;
   depositing a refractory metal material layer on the first insulating film and surface of said semiconductor substrate;
   removing said refractory metal material except for a residual portion at the side wall of said first insulating film to produce a gate electrode;
   removing said first insulating film;
   producing intermediate concentration regions in said semiconductor substrate by ion implantation using said gate electrode as a mask;
   depositing a second insulating film on the gate electrode and the surface of said substrate having first and second side walls adjacent the gate electrode, the first side wall being wider than the second side wall;
   producing relatively high dopant concentration regions in said semiconductor substrate by ion implantation using said gate electrode and second insulating film as a mask; and
   producing a drain electrode on the relatively high dopant concentration region at the first side of the gate electrode and producing a source electrode on the relatively high dopant concentration region at the second side of the gate electrode.

2. The method of claim 1 including controlling removal of refractory metal material to control the width of said residual refractory metal material portion remaining at said side wall of said first insulating film to equal a desired gate length.

3. The method of claim 1 including removing said refractory metal material by anisotropic etching.

4. The method of claim 1 including reactive ion etching said refractory metal material using a mixture of $CFH_3$ and $O_2$.

5. The method of claim 1 including implanting impurities in said relatively high dopant concentration region to a concentration of about $3 \times 10^{13}/cm^2$ and in said intermediate dopant concentration region to a concentration of about $7 \times 10^{12}/cm^2$.

6. The method of claim 1 including depositing one of $WSi_x$, WN, and WSiN as said refractory metal material.